US011056902B2

(12) United States Patent
Muntes et al.

(10) Patent No.: US 11,056,902 B2
(45) Date of Patent: Jul. 6, 2021

(54) BATTERY MANAGEMENT ASSISTANT

(71) Applicant: CA, Inc., Islandia, NY (US)

(72) Inventors: Victor Muntes, Barcelona (ES); Steven Greenspan, Islandia, NY (US); Marc Sole Simo, Barcelona (ES)

(73) Assignee: CA, INC., San Jose, CA (US)

( * ) Notice: Subject to any disclaimer, the term of this patent is extended or adjusted under 35 U.S.C. 154(b) by 660 days.

(21) Appl. No.: 15/940,335

(22) Filed: Mar. 29, 2018

(65) Prior Publication Data

US 2019/0305383 A1 Oct. 3, 2019

(51) Int. Cl.
*H02J 7/00* (2006.01)
*H01M 10/48* (2006.01)
*H01M 10/42* (2006.01)
*G01R 31/382* (2019.01)

(52) U.S. Cl.
CPC .......... *H02J 7/0071* (2020.01); *G01R 31/382* (2019.01); *H01M 10/425* (2013.01); *H01M 10/48* (2013.01); *H02J 7/0047* (2013.01); *H01M 2010/4271* (2013.01); *H02J 7/0048* (2020.01)

(58) Field of Classification Search
None
See application file for complete search history.

(56) References Cited

U.S. PATENT DOCUMENTS

| 5,701,068 | A | 12/1997 | Baer et al. |
| 8,023,984 | B2 | 9/2011 | Jin et al. |
| 9,009,502 | B2 | 4/2015 | Udeshi et al. |
| 9,058,128 | B1 | 6/2015 | Robison et al. |
| 9,160,833 | B2 | 10/2015 | Wu et al. |
| 9,619,010 | B1 | 4/2017 | Marathe et al. |
| 2010/0194632 | A1 | 8/2010 | Raento et al. |
| 2013/0122804 | A1 | 5/2013 | Narendra |
| 2014/0244191 | A1* | 8/2014 | Oka ...................... G06F 1/3206 702/61 |
| 2017/0150443 | A1 | 5/2017 | Hijazi et al. |
| 2018/0115871 | A1* | 4/2018 | Bacarella .................. H02J 7/34 |
| 2018/0145514 | A1* | 5/2018 | Prabhakar ............. H02J 7/0071 |

OTHER PUBLICATIONS

H. Rahimi-Eichi, H., et al., "Battery Management System: An Overview of Its Application in the Smart Grid and Electric Vehicles," in IEEE Industrial Electronics Magazine, vol. 7, No. 2, pp. 4-16, Jun. 2013.

* cited by examiner

*Primary Examiner* — David V Henze-Gongola
(74) *Attorney, Agent, or Firm* — Shook, Hardy & Bacon L.L.P.

(57) ABSTRACT

Provided is a process of determining a future battery level of one or more battery-powered computing devices, the process including: accessing an event record in memory describing a scheduled event in which a user of a plurality of computing devices is scheduled to participate, inferring a subset of the plurality of computing devices to be used in that time period, determining present battery levels of the computing devices, the levels being values indicative of an amount of energy stored by batteries, determining present usage rates of battery energy, inferring battery outlooks corresponding to the scheduled event, a battery outlook being an estimated amount of energy consumption attributable to the scheduled event, and predicting future battery levels of computing devices based on at least a present battery level, a present usage rate, and a battery outlook corresponding to the scheduled event.

18 Claims, 7 Drawing Sheets

BATTERY MANAGEMENT ASSISTANT

CROSS-REFERENCE TO RELATED APPLICATIONS

No cross-reference is presented at this time.

BACKGROUND

1. Field

The present disclosure relates generally to managing the battery level of devices and, more particularly, to optimizing (or otherwise improving) device usage to ensure (or otherwise increase the likelihood of) availability of battery-powered devices.

2. Description of the Related Art

Battery operated devices have become innumerous with increasing functionality for each device. Smart phones, smart watches, tablets, laptops, smart cameras, etc., are relied upon in a number of different applications and environments in part because of their high portability and flexibility. However, these devices often require charging and frequent management of battery levels to ensure availability for usage when remote from a power source.

Existing power management systems do not contemplate the interrelationship of devices, including the overlap of functionality of devices, and do not contemplate various battery saving techniques. For instance, some approaches purports to determine the appropriate time to charge a device, but do not contemplate shifting usage between devices and the many options that provides, including balancing tasks between devices, or account for the resulting complexity that arises when the space of responsive strategies is increased.

SUMMARY

The following is a non-exhaustive listing of some aspects of the present techniques. These and other aspects are described in the following disclosure.

Some aspects include a process of determining a future battery level of one or more battery-powered computing devices, the process including: accessing, with one or more processors, an event record in memory describing a scheduled event in which a user of a plurality of computing devices is scheduled to participate in the future; inferring, with one or more processors, a subset of the plurality of computing devices to be used in a time period corresponding to the scheduled event; determining, with one or more processors, present battery levels of the subset of the plurality of computing devices, the levels being values indicative of an amount of energy stored by batteries; determining, with one or more processors, present usage rates of battery energy by the subset of the plurality of computing devices; inferring, with one or more processors, battery outlooks corresponding to the scheduled event, a battery outlook being an estimated amount of energy consumption attributable to the scheduled event; and predicting, with one or more processors, future battery levels of the subset of the plurality of computing devices based on at least a present battery level, a present usage rate, and a battery outlook corresponding to the scheduled event to improve battery usage or battery management of the computing device.

Some aspects include a tangible, non-transitory, machine-readable medium storing instructions that when executed by a data processing apparatus cause the data processing apparatus to perform operations including the above-mentioned process.

Some aspects include a system, including: one or more processors; and memory storing instructions that when executed by the processors cause the processors to effectuate operations of the above-mentioned process.

BRIEF DESCRIPTION OF THE DRAWINGS

The above-mentioned aspects and other aspects of the present techniques will be better understood when the present application is read in view of the following figures in which like numbers indicate similar or identical elements.

Figure 1:
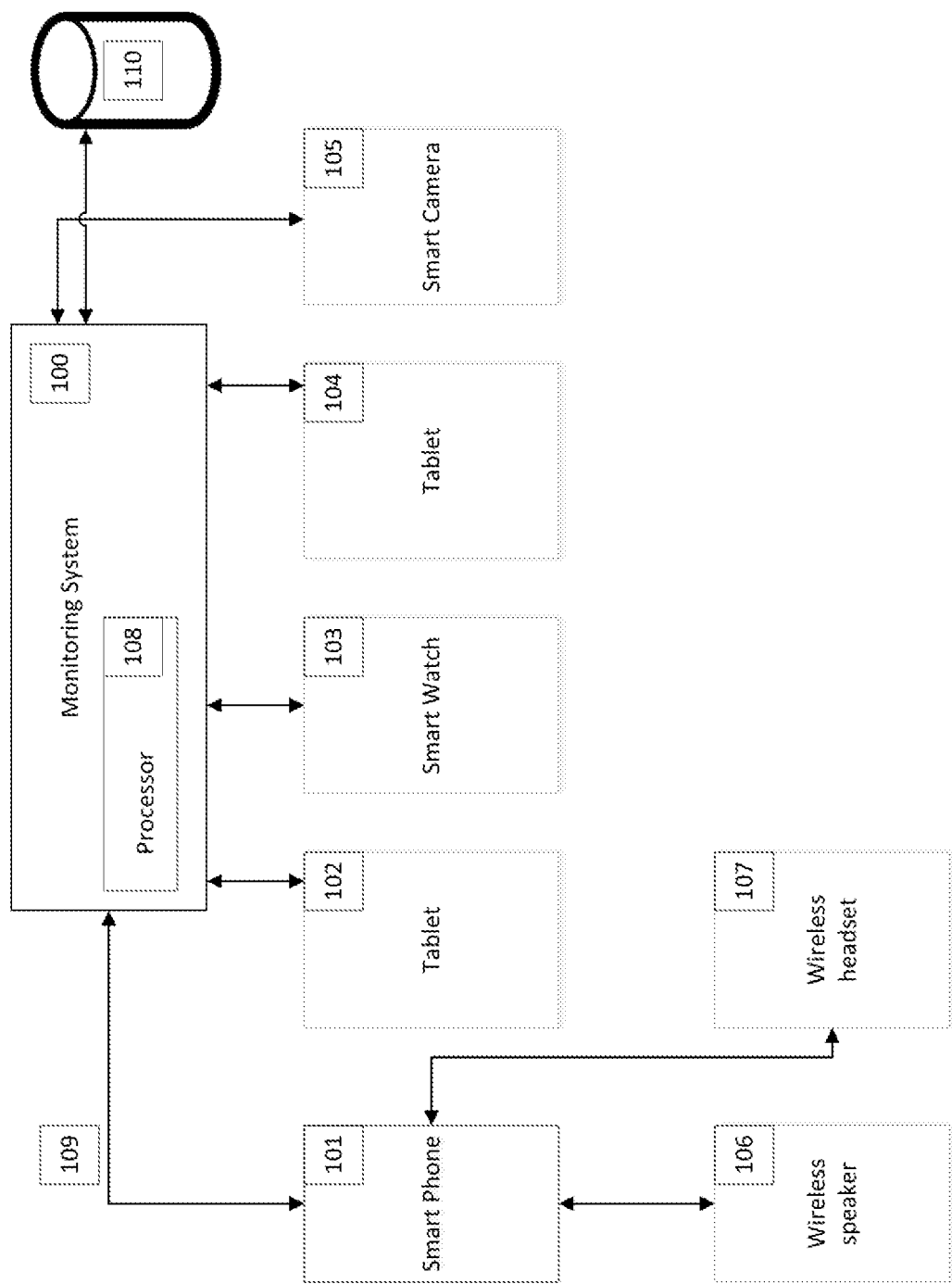
FIG. 1 is a representation of interconnected devices in accordance with some embodiments of the present techniques.

While the present techniques are susceptible to various modifications and alternative forms, specific embodiments thereof are shown by way of example in the drawings and will herein be described in detail. The drawings may not be to scale. It should be understood, however, that the drawings and detailed description thereto are not intended to limit the present techniques to the particular form disclosed, but to the contrary, the intention is to cover all modifications, equivalents, and alternatives falling within the spirit and scope of the present techniques as defined by the appended claims.

DETAILED DESCRIPTION OF CERTAIN EMBODIMENTS

To mitigate the problems described herein, the inventors had to both invent solutions and, in some cases just as importantly, recognize problems overlooked (or not yet foreseen) by others in the field of mobile device power management. Indeed, the inventors wish to emphasize the difficulty of recognizing those problems that are nascent and will become much more apparent in the future should trends in industry continue as the inventors expect. Further, because multiple problems are addressed, it should be understood that some embodiments are problem-specific, and not all embodiments address every problem with traditional systems described herein or provide every benefit described herein. That said, improvements that solve various permutations of these problems are described below.

Some embodiments improve the use of a device or coordinate the usage of multiple devices to maximize (or otherwise increase) battery life or ensure (or increase the likelihood of) availability of the battery powered devices at certain times and for certain uses. Some embodiments afford these features by predicting the future uses of devices, e.g., based on tendencies or scheduled events of a user. Some embodiments train or otherwise configure a predictive model based on historical logs of usage of the device by the user, and predictive analysis based on the model may estimate whether current battery levels are sufficient. Responsive to predictions, some embodiments recommend different usage patterns in the future to reserve some battery capacity for certain events, recommend charging (at a current or future time based on a later arising context, such as proximity to a charging station), or alter the usage or operation of different devices. Some embodiments cause a device or a series of interconnected devices to be monitored by a centralized monitoring system that gauges the battery levels of the various devices, gauges the usages of the devices, and monitoring use and charging opportunities to ensure (or increase the likelihood of) availability of appropriate devices at all (or more than with traditional techniques) needed times.

Users frequently rely on multiple rechargeable battery powered devices throughout a day or other period. Examples include laptop computers, smart phones, smart watches, one- and two-way pagers, battery powered headsets (and other wearable computing devices), portable televisions, tablets, and other devices. Other examples include interconnected devices that are exemplars of the internet-of-things, including smart meters, smart vending machines, smart televisions, sensors, transponders, intelligent thermostats, intelligent refrigerators, and the like. These devices are merely exemplary (which is not to suggest that other descriptions are limiting) and other examples are expected to be similarly interconnected in the future. Devices appropriate for use with this system include a battery or other on-board power source. In some cases, the device is a mobile computing device, such as a hand-held or wearable mobile computing device. The power source can include, for example, at least one rechargeable battery, but could also include solar cells or a 220V AC power supply. The device may be charged, in some cases, for example, by being plugged into an outlet, placed in a docking stating, or placed on a charging pad by which the device is inductively charged.

As shown in FIG. 1, devices 101-107 are monitored by a monitoring application executing on a single or multiple processors, which in some cases, may be networked together. In some cases, the monitoring application is a distributed application executing on a plurality of devices, which may include peers in a peer-to-peer architecture or clients or servers in a client-server architecture. The processor 108 within the central monitoring hub 100 can be exterior to the devices to be monitored, or can be within or collocated with a monitored device. The monitoring may be accomplished via transmissions 109 of any suitable sort, including direct wireline communications, via Bluetooth transmissions, Ethernet, hard connection through busses, or information that would otherwise be transmitted may be inferred by operation of predictive software based on historic or assumed usage reported from each of the interconnected devices to a central monitoring hub 100. The transmissions 109 may be accomplished through a query-and-response or a timed transmission. Transmitted data may be pushed or pulled, and transmitted data may be held in a buffer prior to transmission until some quantum of data is buffered or threshold time has elapsed to conserve bandwidth and power (and in some cases, afford resiliency to temporary loss of wireless network connections). The transmissions can be directly to the central monitoring hub 100 or from peripherals 106-107 through a primary device 101 (e.g., a wearable device may communicate via a user's smart phone). In some embodiments, transmissions are sent, in the case of a web-based interface via appropriate transfer protocols such as HTTP, HTTPS, or other application-layer protocols, and in telecommunications deployment through repeaters, gateways and nodes, e.g., via transport layer protocols like TCP or UDP and network layer protocols like the Internet Protocol. The transmissions may send information to a central database 110, and that information can correspond to, in certain embodiments, (or encode in a time-stamped message with a unique identifier of the transmitting device that distinguishes the device from other monitored devices) a present battery power level, current activity, and battery usage rates.

Figure 2:
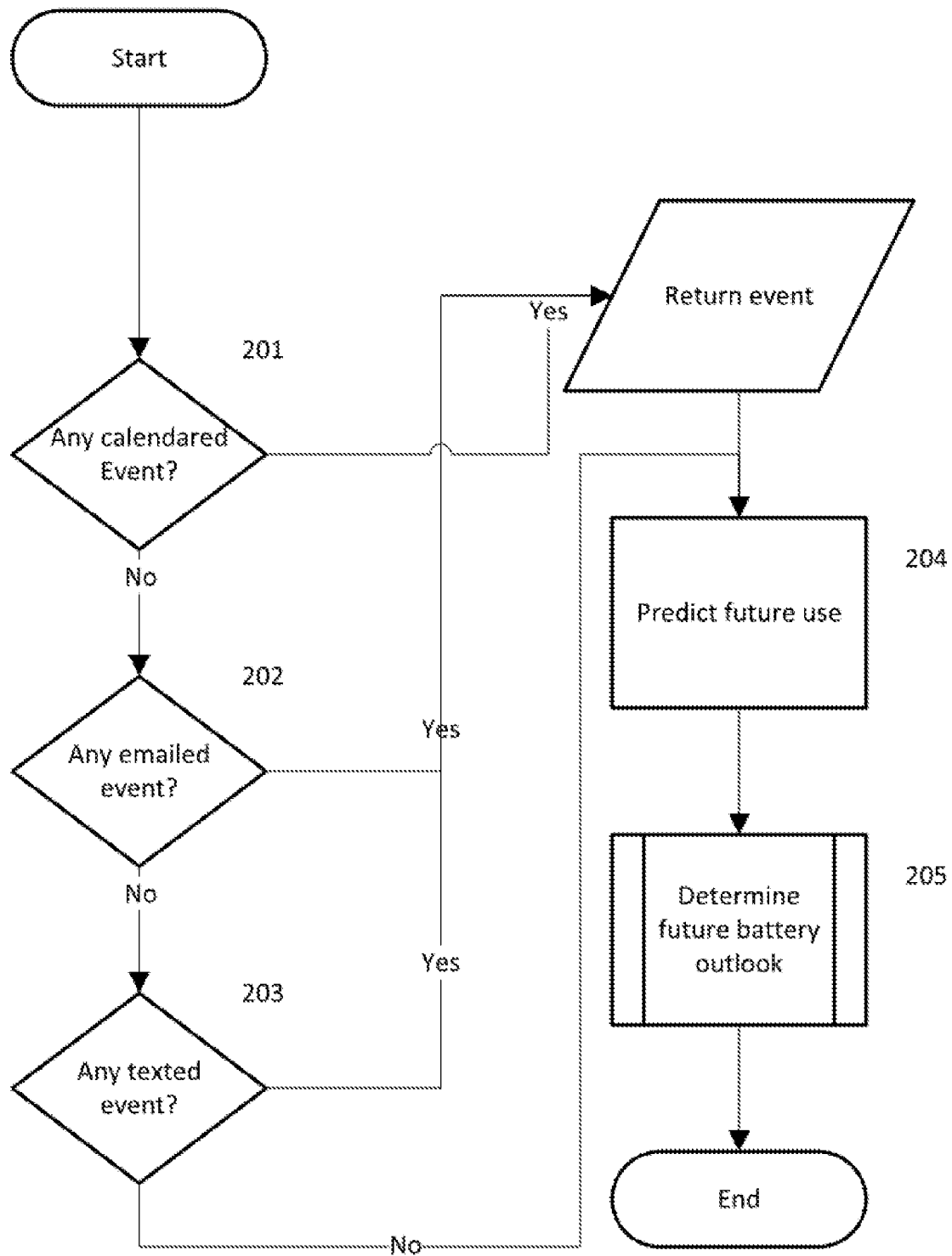
FIG. 2 is a flow chart showing an example of a process that determines expected battery usage based on a future event in accordance with some embodiments of the present techniques.

The monitoring system, in some embodiments, by operation of a monitoring process, predicts future battery needs (e.g., of each device, or of a collection of devices associated with a user) through a detailed assessment of predicted future uses and predicted future charging ability (e.g., based on predicted geolocations of the user and charging context of those geolocations). As shown in FIG. 2, the future uses may be predicted based on data collected through a query of scheduling software (e.g., Microsoft Outlook™ calendar) 201, through natural language processing of unstructured human readable text in emails 202 and text messages 203, and through historical usage.

If, for instance, a query response reveals the user's calendar includes a flight as a calendared event 201 during a certain time period, the system may engage in a subprocess 205 to determine the battery outlook for that calendared event (e.g., likelihood of use of the device at that event, importance of access to the device for the event, amount of use of the device at the event, utility curves associated with different amounts of usage afforded by different amounts of available power, amount of power consumed by the user at the event, amount of battery power remaining when the event occurs, or estimated probability curves or predictions and bounding boxes of predictions thereof). Among the subprocess 205, responsive actions may be a test to determine whether charging is available and the test may recognize that no charging is available during the flight, and test whether certain usages are available at that time, which may return appropriate information (e.g., wireless data through a cellular LTE network would be unavailable). In certain embodiments, the system may query the specific aircraft used in travel and the seat of the user. Based on query results, the system may return the appropriate charging abilities, recognizing that certain aircraft at certain locations have charging ability.

The subprocess 205 may analyze the types of tasks associated with the future event and the devices capable of performing that task. If, for instance, the user has a presentation scheduled (as indicated by a query response from a calendar API), some embodiments of the system can predict particular device usages for the presentation based on a number of criteria. The subprocess 205 may determine, as a presenter, it is more likely that the user will be using the laptop computer and not using the cellular antenna during this period. In various embodiments, this likelihood is determined in different ways in the subprocess 205, including one or more of historical usage (e.g., in previous circumstances where a query of the user's calendar indicated she was a presenter, what devices were used and in what amount), lookup tables (e.g., a pre-populated table indicates different devices and different usages for 'presenters'), dynamic mass information (e.g., centralizing monitoring software gathers accompanying device usage for other users that are 'presenters', scaled and updated as appropriate based on location, biographic user type, usage type, frequency and other relevant data). Anticipated future uses 204 can be based on the user's historical use or received information of others' historical use. For instance, if the user tends to browse the internet at certain times of day, some embodiments of the monitoring system can estimate the likelihood of browsing at that time again. Or, if a new user without adequate historical data begins using the device, some embodiments of the system can predict future use based on mass information of other uses. In certain embodiments, the likelihood of future usage can be tailored based on biographic, geographic, or other specific details (e.g., the costs of data over specific networks). These uses, in turn, may be subject to the subprocesses 205 to determine type of device, type of task, battery usage rates during that task.

In certain embodiments, future uses of the devices are determined by one or more of (1) analysis of messages including email, text messages, or transcribed voice messages by natural language processing (NLP) (e.g., a trained NLP model may associate certain n-grams with an amount of power consumption); (2) querying scheduler software for scheduled events (in some cases applying NLP to event descriptions, and in some cases querying a geographic information system for charging context of locations of events); (3) logs of historical usage of the user; (4) logs of historical usage of other users; and (5) known events. If there is no known association with the scheduled event and a historical event, natural language processing can be used to determine the type of event including the usage of certain n-grams, e.g., learned n-grams of "Tom's baseball game." In some embodiments, these techniques can be combined, e.g., with an ensemble model or pipeline of models.

Figure 3:
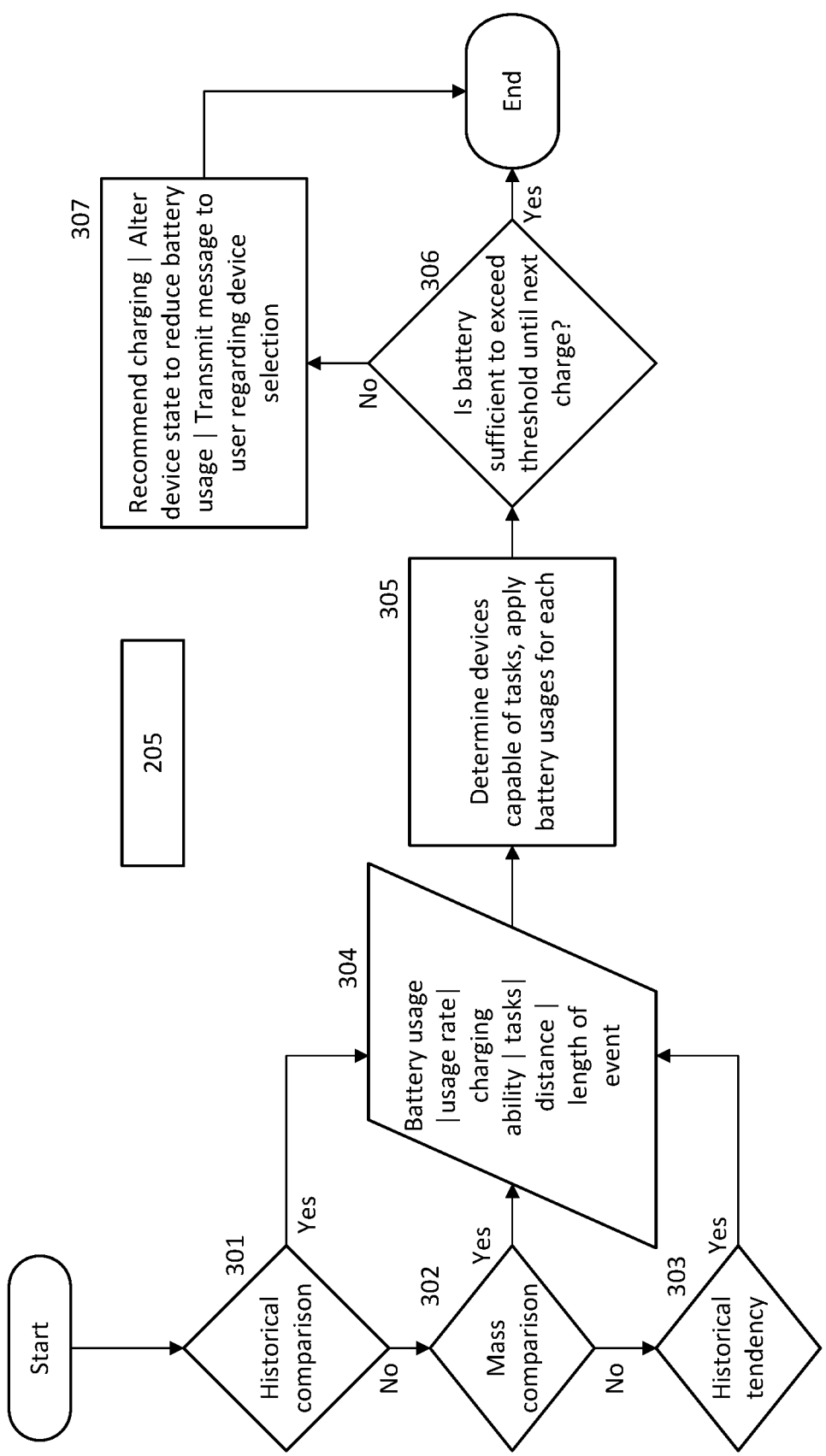
FIG. 3 is a flow chart showing an example of a process by which a system responds to the determination of FIG. 2, in accordance with some embodiments of the present techniques.

An example of some embodiments of subprocess 205 is shown in FIG. 3. If, for instance, an Outlook™ calendar event shows an entry for a 1-hour presentation to be made at 4 p.m. from a particular office, some embodiments of the subprocess 205 can infer an amount of battery usage (and in some cases relative importance of that consumption to the user) based on the term 'presentation' through associating 301 "presentation" with a previously entered presentation in the calendar (a historical comparison), by comparing it with web-based information regarding a presentation 302, via hand-coded rules, or through machine learning of identification of the tendencies of a person when entries have certain n-grams or behaviors follow particular entries 303. With this information, some embodiments of the system determine 304 appropriate data on which it can make its analysis, including the type and amount of device usage at the presentation. Some embodiments can determine the present geolocation of the user and the geolocation of the office (e.g., by detecting addresses with a regex, or parsing addresses from an address field of an event record) and then query a geographic information system and routing application to approximate the amount of time to drive to the office for the presentation, and based on historical behavior of the user some embodiments can determine the type and amount of usage while in transit (e.g., the historical usage indicates that she uses a smart phone for navigation purposes during the drive), for instance in a case where there is a known location of a home, where a commute time home can be determined, and a baseline battery consumption rate for a commute can be applied.

Based on this calendar entry combined with historical uses, in some embodiments, future potential uses of devices can be determined (e.g., predicted with greater than a threshold level of confidence) 305 and future charging opportunities can be identified (e.g., predicted with greater than a threshold level of confidence). Any of the events can be scaled as appropriate within the determination step 305. A one-hour presentation can be scaled from a simple scaling factor based on historical presentations, e.g., usage during a 30 minute presentation by that user can be doubled, or more sophisticated scaling factors can be used based on a variety of user-specific data, event-specific, or generalized data, such as (1) user biographic data, (2) user location data, (3) future user location data; (4) various environmental conditions (e.g., weather data wherein appropriate factors are determined for increased cold weather discharge of batteries), (5) event type, (6) event length. The system, in some embodiments, analyzes 306 whether a particular device will have sufficient battery to perform the task. If it will (e.g., is predicted to with greater than a threshold confidence), no further action is needed. If not, in various embodiments, the system may be caused to respond differently, as shown in 307, including recommendation of charging the device, using a different device, reconfiguring the device, prioritizing usage of devices, etc. These recommendations, in some cases, may be presented to the user or provided to a process by which recommended actions are taken (e.g., decreasing screen brightness, reducing radio transmit strength, decreasing beaconing frequency, adjusting thresholds to enter lower-power states, and the like).

In some embodiments, the coordination of multiple devices can be used to recommend which device to use (among the multiple devices of a user), to recommend charging, to recommend specific features to activate or deactivate, to prioritize device usage, or can automatically reconfigure or alter the state of a particular device. Some embodiments may maintain in memory a set of user profiles, and each profile may include a set of devices known to be used by the user. In some cases, messages to or from these devices may include an identifier by which the profile is identified from among a plurality of profiles of a plurality of users. In some embodiments, the system or a device coordinated by the system disclosed includes at least one power management module or component controlled by one or more processors which monitors the battery level and usage rates. For instance, some embodiments of the monitoring system can predict the future data usage (e.g., through querying a calendar application and returning a recognized activity such as attending a sporting event followed by a drive home). Based on that information, some embodiments can predict a type of usage and determine the devices capable of that usage and determine a likelihood of powered use at that event (e.g., attendance at a sporting event will entail a likelihood of use of a camera and cellular internet capabilities and the drive home has a likelihood of usage of cellular calls; the user has an interconnected smart phone capable of all uses and a tablet capable of all uses except cellular calls; neither the sporting event nor the car offer charging opportunities). The current power levels of the relevant devices may be probed (e.g., the smart phone is 40% charged and the tablet is 90% charged), for instance by querying a battery level and charging state API of a device operating system. Some embodiments of the system can transmit to the user various messages, including, e.g., a recommendation to use the tablet at the sporting event so that the smart phone battery is preserved for the drive home, a recommendation to charge the devices for a certain length of time to ensure usage of either devices will not overwhelm the battery level prior to location of a charging opportunity. In certain embodiments, the system will transmit a message to prioritize usage among the devices.

In certain embodiments, the system may configure devices to maximize (or otherwise increase) battery lifespan when needed (or increase the likelihood that battery power is available at a future event for which a specified quantum of battery power is predicted to be needed with greater than a threshold urgency score). As with the above scenario, the system may analyze current battery levels, current charging state (e.g., is the device plugged in), usage rate, future expected uses, individual components' usage, and likelihood of charging and configure the devices based on risk of the usage will deplete the batteries. A change of configuration of the device can be of various different types, including e.g., the power management module controlling the dimming of the screen, entering sleep mode, switching off antennas, closing certain applications, slowing cycles of certain applications such as reducing the rate of pulling messages from a server. In some embodiments, battery power by be analyzed in terms of battery energy (e.g., without regard to the rate at which the energy is provided, i.e., power).

To determine the battery level at a given time, some embodiments of the system may obtain the present battery level through such methods as querying an API of the operating system that determines the battery level via battery firmware. A process does not need to interface directly with battery firmware or be battery firmware to make this determination. Likewise, to determine the present usage rates of battery energy (or power), the system may obtain a battery usage rate through such methods as querying an API of the operating system that determines the battery level and measuring differences in battery levels over a particular period of time suitable for the needs of the device. Some embodiments may query the operating system for battery usage attributable to different applications and log this information to train the above-described predictive models.

For instance, a present battery usage rate Ru at present time and could be a timed average (or other measure of central tendency) $R=|(B_1-B_0)/(t_1-t_0)|$, based on the change of battery levels over the time period. This corresponds to a measure of central tendency of power consumption over a trailing during of $t_1-t_0$ minutes. The present battery rate can itself be a level over a sufficient period of time or an instantaneous battery level at a given time t prior to the calculation process discussed herein. For instance, the system may calculate the usage rate R (and other calculations discussed herein) which will take as the present battery level the result of a query of battery level and store that value for use throughout the calculation as a suitable present battery level. Similarly, other values potentially used in the process may depend on instantaneous values or present values, but may actually be values taken at a time or over a very short interval (e.g., 100 milliseconds) of time prior to the process running. In certain embodiments, the usage rates can be determined by substituting in usage rates at identified periods in the past. They can also be determined by identifying one or more applications in use or the application to-be used and querying a log for previous times the applications were in use and determine the usage rate in those previous occurrences. The usage rates can also be determined on a task-by-task basis, such as battery usage of a camera on a per-picture basis or battery usage of a smart phone on a per-email, per-text message, or per-call basis. Usage rates may also be determined based on the number and type of peripheral devices connected with the computing device, such as a smart watch and wireless headphones interconnected with a smart phone, and a determination of the baseline battery usage rate for maintaining the interconnection.

In certain embodiments, to determine estimated power consumption associated with an event, the system may do one or more of the following: (1) estimate based on the battery level usage over a similar event in the past and scaling, e.g., to estimate the battery usage of a device for a future sporting event, the system may query one or more previously made logs of battery levels that correspond with sporting events in the past that had a battery level $B_0$ when the event began at to and ended with a battery level of $B_1$ when the event ended at $t_1$ and use that difference in battery levels as the estimate of future energy usage for the sporting event; (2) scale the estimate, for instance, with operations in which the future energy consumption for a scheduled event is taken from historic usage as previously described, but scaled to fit the future scheduled event, for example, when the user has a 3 hour flight scheduled, the system may query battery usage rates for one or more other flights and scale the usage to 3 hours; (3) estimate energy consumption based on similar events (e.g., of the same type, or with the same n-grams in event descriptions) by other users and scaled if necessary, for instance query a mass networked database such as one created through the internet to determine how much battery consumption occurs during a sporting event for the queried public at large; (4) scale any differences between the data and the user's devices, e.g., derived scaling factors based on different devices, different conditions, different types of users, different geographic locations, different events. In certain embodiments, determining usage of data from analyzing past events is based on determining a marginal increase over baseline usage attributable to the past event. For example, a battery log may record the battery levels $B_0$ and $B_1$ at the beginning and end of a sporting event. The marginal portion attributable to the sporting event can be calculated as a difference between $B_0$ and $B_1$ or the difference factoring out the battery depletion that would have occurred but-for the scheduled event, that is battery level drainage during a similar period of time without any usage or during a similar period under ordinary usage when no scheduled event is occurring. This baseline battery usage may be subtracted from the difference between $B_0$ and $B_1$ to determine the amount of energy usage attributable to the historical event.

Estimates of battery outlook can be iteratively improved through repeated processes and through repeated analysis of battery usage in historical processes. Pertinent details of events can be isolated to more accurately determine likelihood of certain events. For example, historical logs may show a high likelihood of a commute home every weekday and associated device usage, but repeated learning can extract behavior of certain day after repeated use, such as a tendency to go to a known store on a given weekday or to go to an unknown restaurant (and increased likelihood of use of navigational systems) on a given weekday. These model parameters may be iteratively learned by the system, weighing recency, frequency, weekly, monthly, or annual habits.

Figure 4:
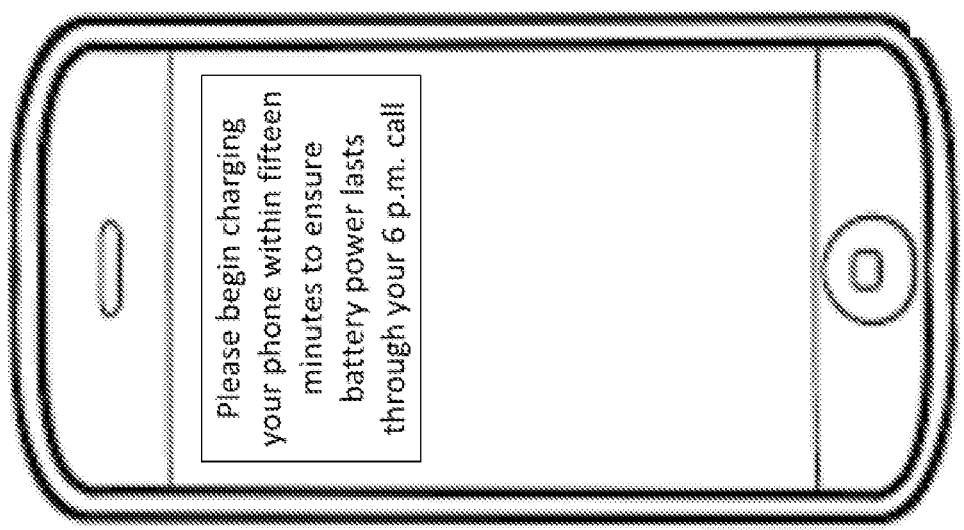
FIG. 4 is a representation of a message transmitted as a result of a determination of inadequate battery life in accordance with some embodiments of the present techniques.

Charging suggestions can be based on geographic location. Devices can be geolocated through various means, including global positions system signals, use of wireless access points, and triangulation from cellular towers acknowledgment signals. Some embodiments may query a geolocation framework of an operating system of a mobile device, such as the coreLocation framework in iOS™ or the android location API in Android™. In some embodiments, returned geolocation can be associated with charging likelihood and charging availability. For instance, when a device has been charged at a particular location, such as a house or an office, the geolocation of the charging location can be logged as a location for which charging is available (e.g., in a geographic information system later queried for this information). For users without sufficient historical usage logs or in areas where the devices have not been, the charging availability can be determined through an interconnected network of similar devices (e.g., as reported to a central repository by a background process of a native application executing on mobile devices). As shown in FIG. 4, this information can be used for messages regarding charging needs. For instance, when the device is in a location known to be available for charging and the analysis disclosed herein shows that a future battery level will be below a certain threshold, in some embodiments, the device can cause to be transmitted to the user a message that recommends charging, e.g., "You should charge your cell phone now to ensure that the battery will last until you finish your commute." In certain embodiments, this information could also be used to communicate information to more than one interconnected user for devices, for instance to send a message to a family member to begin charging a device that a primary user will need later, e.g., "Please begin charging Bob's tablet to ensure its availability tonight."

Figure 5:
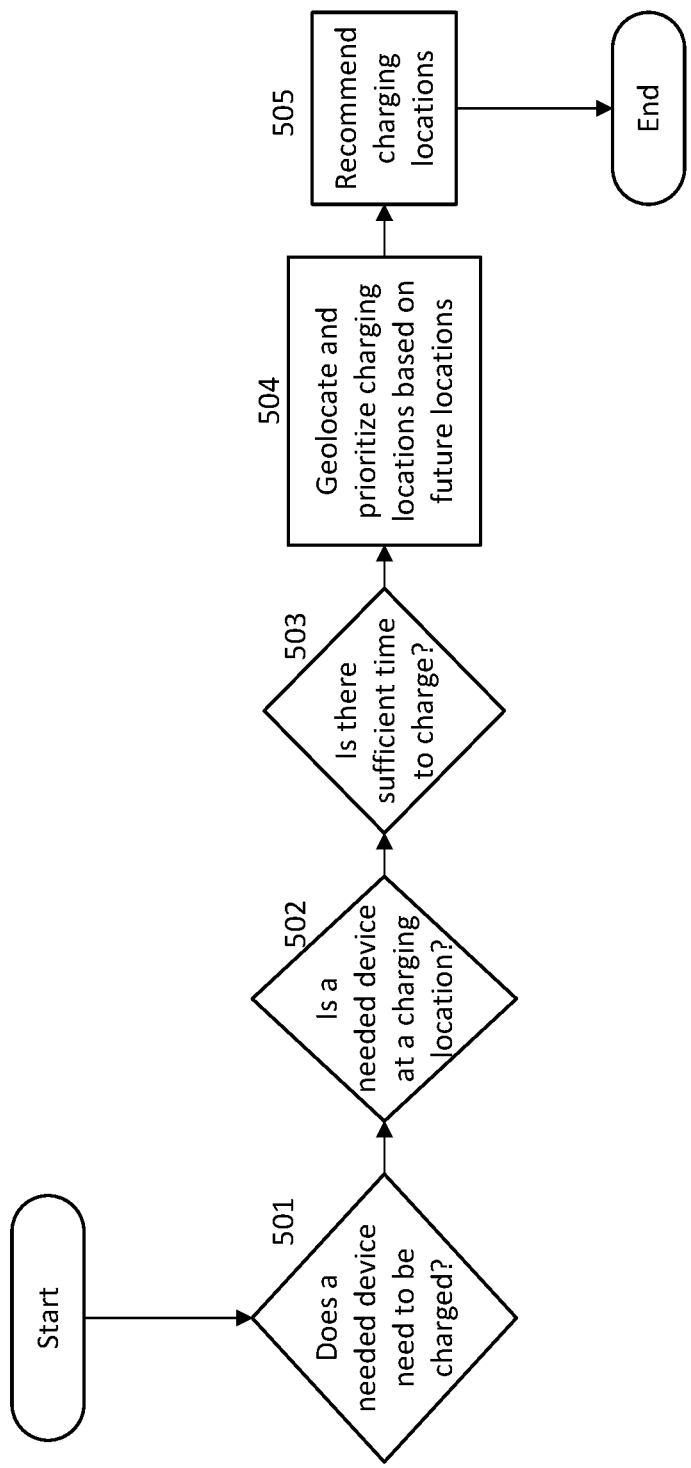
FIG. 5 is a flow chart showing a process to recommend action based on geolocation of a user and a charging location in accordance with some embodiments of the present techniques.

The geolocation of charging locations and timing of the user's presence at that location can be used to choose appropriate charging locations, and to be inserted in messages to the user as appropriate, e.g., "Your last opportunity to charge your device will be at the airport until you arrive at the hotel 6 hours later. Ensure at least 90% battery level prior to your flight." One embodiment of this logic is shown in FIG. 5. In some embodiments, the system returns the future events and devices needed for those events, and whether they need charging 501. If so, the system may query known charging locations, and if the device is at such a location and if sufficient time before a future event remains, it may recommend charging as shown on items 502 and 503. If not, in some embodiments, the future event and the path in transit for the events are analyzed, and the geolocations of each, and compares the geolocation of known or expected charging locations with the geolocations of the user in transit and at the destination as shown in 504. If the geographic distance (e.g., in travel time by a specified mode or Euclidian distance) between the geolocation of a charging location and the geolocation of the user is below a threshold, the charging location is returned as a potential charging location 505. The subprocess of recommending a preferred charging location can be based on many factors, including: the number of devices needed to be charged, the length of time until a next charge is available, the present and future usage rates, the distance to the charging location, and the amount of time the user is expected to be at a charging location.

In certain embodiments, the system can cause to be provided to the user or to an associated person messages related to the battery levels. For instance, the system can trigger a pre-set message or customizable message via email, SMS, MMS, automated voice message, instant message, etc. to communicate to the user messages. Embodiments are not limited to these messages (which is not to suggest that other descriptions are limiting), and examples include any manner of signaling to the user or other person. In certain embodiments, when the analysis herein determines that the future battery outlook indicates that future battery levels will be below a threshold amount, the system may trigger (e.g., cause to be presented) certain messages. In certain embodiments, an appropriate message is selected directed to suggesting charging, suggesting reduced use of a device, suggesting altering the usage state of a device, suggesting alternate devices to use, and suggesting prioritization of devices to use. In some embodiments, a client may notify the mail submission agent of a message to send through a simple mail transfer protocol (SMTP). It may then be transmitted through the internet to the receiver and the mail storage and delivery agent. An IMAP message may be viewed or a POP message may be transmitted to a device. In some embodiments, the client comprises an automated system with a triggering logic that based on the battery outlook after a certain future event and a threshold level, and compares the two. If the battery outlook is lower than the threshold amount, the client may cause to be transmitted an appropriate message. For instance, if the battery outlook for a device is below a pre-set threshold of 5% of battery life, the device will transmit through the email system described above a message stating "Your cell phone may run out of battery before the end of your 6 p.m. call. Please charge your device now."

In certain embodiments, the system may alter the usage state or the settings of the devices. To conserve battery usage when a battery outlook meets a threshold, the system may with respect to certain devices lessen screen brightness, alter the clock speed, or reducing the threshold for entry into a reduced power mode of a processor. Other alterations are possible as well, including reducing transmission power, turning off certain antennas, turning off applications, and switching to silent mode. These are expected to allow for coordination of battery lives of devices in consideration of their future needs without charging.

In certain embodiments, messages are associated with events and uses of the devices. For instance, a message notifying the user she needs to charge her smart phone may be associated with a notification signal that the smart phone is charging. If, within a threshold time, no signal is received indicating that the smart phone is being charged or alternatively a signal is received indicating the smart phone is not being charged, the system may log that the message was ineffective at altering the behavior of the user. A signal may be sent that the device is not being charged through any number of methods, including indirectly through querying an API to determine that the battery level at $t_1$ is less than the battery level at previous to, and generating an acknowledgment message to be transmitted, or directly through signals generated when, e.g., a USB detector detects supplied voltage on data pins in the device. In response, in some embodiments, a message in the future can be changed, a subsequent reminder message can be sent, a subsequent different message can be sent, or a device can be configured automatically. For instance, if a message to charge a smart phone is sent because a battery outlook is below a threshold, but the user does not respond within a threshold time, the system can cause the smart phone to enter sleep mode more quickly to conserve battery.

The system can operate in a variety of environments. One such environment is an interconnection through the Internet. With each smart device in communication with the internet, servers are interconnected to the device to run programs or execute scripts that can probe the devices for the necessary information discussed herein, e.g., present battery levels, expected future use, etc.

Figure 6:
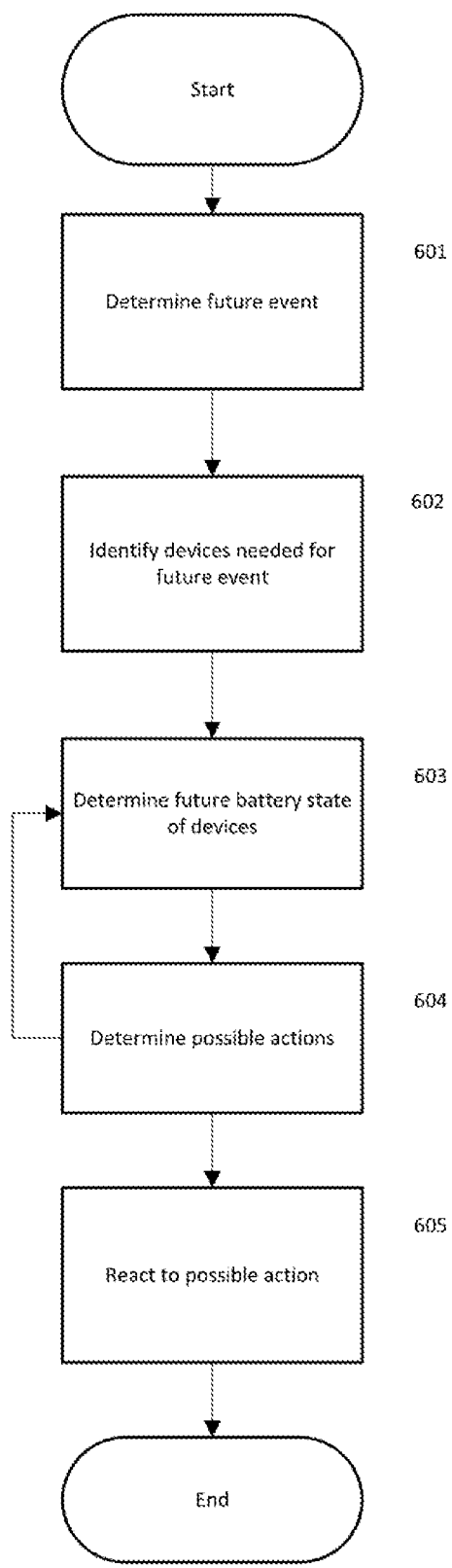
FIG. 6 is a chart showing examples of various subprocesses to coordinate uses of devices to maximize (or otherwise increase) battery life in accordance with some embodiments of the present techniques.

As shown in FIG. 6, in certain embodiments, the system includes five subprocesses (the functionality of which may be implemented in distinct bodies of code, or the code may be intermingled in any permutation or otherwise differently arranged, each with potential varieties of their own subprocesses. As discussed, in some embodiments, a future event is identified 601. Through various techniques, devices may be identified (e.g., selected from among a larger set) that would be used in conjunction with the event 602. Based on, among other things, the present battery level, energy usage rates, and expected or potential usage of the devices in conjunction with the future event, a future battery state is determined 603. Based on that future battery state, a number of possible actions may be determined 604, including identification of appropriate messages transmitted, identification of reconfiguration of devices and whether such reconfiguration would save battery life, charging stations are identified and the amount of time expected to be at the charging location and charging rate is used to determine the amount of charge the device will get. This can be iterative analysis and the future battery state of the devices can be recalculated assuming compliance with the various possible actions. Actions that are deemed sufficient, preferable, or best for battery life of necessary or preferable devices may then be carried out 605, such as a message transmission to charge the device, to switch off the device, to use a different device, or an automatic reconfiguration of a device.

Figure 7:
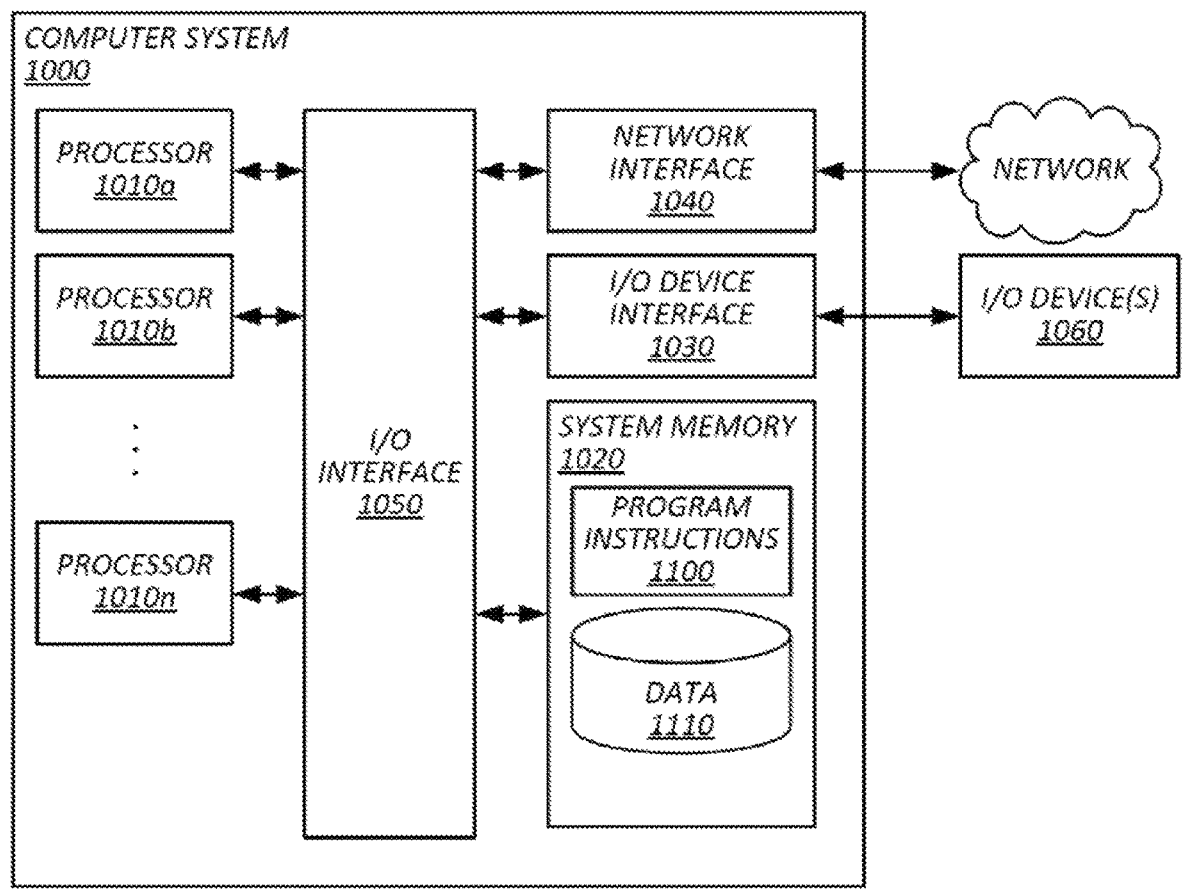
FIG. 7 is an example of a mobile computing device upon which the present techniques may be implemented in accordance with some embodiments of the present techniques.

FIG. 7 is a diagram that illustrates an exemplary computing system 1000 in accordance with embodiments of the present technique. Various portions of systems and methods described herein, may include or be executed on one or more computer systems similar to computing system 1000. Further, processes and modules described herein may be executed by one or more processing systems similar to that of computing system 1000.

Computing system 1000 may include one or more processors (e.g., processors 1010a-1010n) coupled to system memory 1020, an input/output I/O device interface 1030, and a network interface 1040 via an input/output (I/O) interface 1050. A processor may include a single processor or a plurality of processors (e.g., distributed processors). A processor may be any suitable processor capable of executing or otherwise performing instructions. A processor may include a central processing unit (CPU) that carries out program instructions to perform the arithmetical, logical, and input/output operations of computing system 1000. A processor may execute code (e.g., processor firmware, a protocol stack, a database management system, an operating system, or a combination thereof) that creates an execution environment for program instructions. A processor may include a programmable processor. A processor may include general or special purpose microprocessors. A processor may receive instructions and data from a memory (e.g., system memory 1020). Computing system 1000 may be a uni-processor system including one processor (e.g., processor 1010a), or a multi-processor system including any number of suitable processors (e.g., 1010a-1010n). Multiple processors may be employed to provide for parallel or sequential execution of one or more portions of the techniques described herein. Processes, such as logic flows, described herein may be performed by one or more programmable processors executing one or more computer programs to perform functions by operating on input data and generating corresponding output. Processes described herein may be performed by, and apparatus can also be implemented as, special purpose logic circuitry, e.g., an FPGA (field programmable gate array) or an ASIC (application specific integrated circuit). Computing system 1000 may include a plurality of computing devices (e.g., distributed computer systems) to implement various processing functions.

I/O device interface 1030 may provide an interface for connection of one or more I/O devices 1060 to computer system 1000. I/O devices may include devices that receive input (e.g., from a user) or output information (e.g., to a user). I/O devices 1060 may include, for example, graphical user interface presented on displays (e.g., a cathode ray tube (CRT) or liquid crystal display (LCD) monitor), pointing devices (e.g., a computer mouse or trackball), keyboards, keypads, touchpads, scanning devices, voice recognition devices, gesture recognition devices, printers, audio speakers, microphones, cameras, or the like. I/O devices 1060 may be connected to computer system 1000 through a wired or wireless connection. I/O devices 1060 may be connected to computer system 1000 from a remote location. I/O devices 1060 located on remote computer system, for example, may be connected to computer system 1000 via a network and network interface 1040.

Network interface 1040 may include a network adapter that provides for connection of computer system 1000 to a network. Network interface may 1040 may facilitate data exchange between computer system 1000 and other devices connected to the network. Network interface 1040 may support wired or wireless communication. The network may include an electronic communication network, such as the Internet, a local area network (LAN), a wide area network (WAN), a cellular communications network, or the like.

System memory 1020 may be configured to store program instructions 1100 or data 1110. Program instructions 1100 may be executable by a processor (e.g., one or more of processors 1010a-1010n) to implement one or more embodiments of the present techniques. Instructions 1100 may include modules of computer program instructions for implementing one or more techniques described herein with regard to various processing modules. Program instructions may include a computer program (which in certain forms is known as a program, software, software application, script, or code). A computer program may be written in a programming language, including compiled or interpreted languages, or declarative or procedural languages. A computer program may include a unit suitable for use in a computing environment, including as a stand-alone program, a module, a component, or a subroutine. A computer program may or may not correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one or more computer processors located locally at one site or distributed across multiple remote sites and interconnected by a communication network.

System memory 1020 may include a tangible program carrier having program instructions stored thereon. A tangible program carrier may include a non-transitory computer readable storage medium. A non-transitory computer readable storage medium may include a machine readable storage device, a machine readable storage substrate, a memory device, or any combination thereof. Non-transitory computer readable storage medium may include non-volatile memory (e.g., flash memory, ROM, PROM, EPROM, EEPROM memory), volatile memory (e.g., random access memory (RAM), static random access memory (SRAM), synchronous dynamic RAM (SDRAM)), bulk storage memory (e.g., CD-ROM and/or DVD-ROM, hard-drives), or the like. System memory 1020 may include a non-transitory computer readable storage medium that may have program instructions stored thereon that are executable by a computer processor (e.g., one or more of processors 1010a-1010n) to cause the subject matter and the functional operations described herein. A memory (e.g., system memory 1020) may include a single memory device and/or a plurality of memory devices (e.g., distributed memory devices). Instructions or other program code to provide the functionality described herein may be stored on a tangible, non-transitory computer readable media. In some cases, the entire set of instructions may be stored concurrently on the media, or in some cases, different parts of the instructions may be stored on the same media at different times.

I/O interface 1050 may be configured to coordinate I/O traffic between processors 1010a-1010n, system memory 1020, network interface 1040, I/O devices 1060, and/or other peripheral devices. I/O interface 1050 may perform protocol, timing, or other data transformations to convert data signals from one component (e.g., system memory 1020) into a format suitable for use by another component (e.g., processors 1010a-1010n). I/O interface 1050 may include support for devices attached through various types of peripheral buses, such as a variant of the Peripheral Component Interconnect (PCI) bus standard or the Universal Serial Bus (USB) standard.

Embodiments of the techniques described herein may be implemented using a single instance of computer system 1000 or multiple computer systems 1000 configured to host different portions or instances of embodiments. Multiple computer systems 1000 may provide for parallel or sequential processing/execution of one or more portions of the techniques described herein.

Those skilled in the art will appreciate that computer system 1000 is merely illustrative and is not intended to limit the scope of the techniques described herein. Computer system 1000 may include any combination of devices or software that may perform or otherwise provide for the performance of the techniques described herein. For example, computer system 1000 may include or be a combination of a cloud-computing system, a data center, a server rack, a server, a virtual server, a desktop computer, a laptop computer, a tablet computer, a server device, a client device, a mobile telephone, a personal digital assistant (PDA), a mobile audio or video player, a game console, a vehicle-mounted computer, or a Global Positioning System (GPS), or the like. Computer system 1000 may also be connected to other devices that are not illustrated, or may operate as a stand-alone system. In addition, the functionality provided by the illustrated components may in some embodiments be combined in fewer components or distributed in additional components. Similarly, in some embodiments, the functionality of some of the illustrated components may not be provided or other additional functionality may be available.

Those skilled in the art will also appreciate that while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1000 may be transmitted to computer system 1000 via transmission media or signals such as electrical, electromagnetic, or digital signals, conveyed via a communication medium such as a network or a wireless link. Various embodiments may further include receiving, sending, or storing instructions or data implemented in accordance with the foregoing description upon a computer-accessible medium. Accordingly, the present techniques may be practiced with other computer system configurations.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, notwithstanding use of the singular term "medium," the instructions may be distributed on different storage devices associated with different computing devices, for instance, with each computing device having a different subset of the instructions, an implementation consistent with usage of the singular term "medium" herein. In some cases, third party content delivery networks may host some or all of the information conveyed over networks, in which case, to the extent information (e.g., content) is said to be supplied or otherwise provided, the information may be provided by sending instructions to retrieve that information from a content delivery network.

The reader should appreciate that the present application describes several independently useful techniques. Rather than separating those techniques into multiple isolated patent applications, applicants have grouped these techniques into a single document because their related subject matter lends itself to economies in the application process. But the distinct advantages and aspects of such techniques should not be conflated. In some cases, embodiments address all of the deficiencies noted herein, but it should be understood that the techniques are independently useful, and some embodiments address only a subset of such problems or offer other, unmentioned benefits that will be apparent to those of skill in the art reviewing the present disclosure. Due to costs constraints, some techniques disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such techniques or all aspects of such techniques.

It should be understood that the description and the drawings are not intended to limit the present techniques to the particular form disclosed, but to the contrary, the intention is to cover all modifications, equivalents, and alternatives falling within the spirit and scope of the present techniques as defined by the appended claims. Further modifications and alternative embodiments of various aspects of the techniques will be apparent to those skilled in the art in view of this description. Accordingly, this description and the drawings are to be construed as illustrative only and are for the purpose of teaching those skilled in the art the general manner of carrying out the present techniques. It is to be understood that the forms of the present techniques shown and described herein are to be taken as examples of embodiments. Elements and materials may be substituted for those illustrated and described herein, parts and processes may be reversed or omitted, and certain features of the present techniques may be utilized independently, all as would be apparent to one skilled in the art after having the benefit of this description of the present techniques. Changes may be made in the elements described herein without departing from the spirit and scope of the present techniques as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. Limitations as to sequence of recited steps should not be read into the claims unless explicitly specified, e.g., with explicit language like "after performing X, performing Y," in contrast to statements that might be improperly argued to imply sequence limitations, like "performing X on items, performing Y on the X'ed items," used for purposes of making claims more readable rather than specifying sequence. Statements referring to "at least Z of A, B, and C," and the like (e.g., "at least Z of A, B, or C"), refer to at least Z of the listed categories (A, B, and C) and do not require at least Z units in each category. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device. Features described with reference to geometric constructs, like "parallel," "perpendicular/orthogonal," "square", "cylindrical," and the like, should be construed as encompassing items that substantially embody the properties of the geometric construct, e.g., reference to "parallel" surfaces encompasses substantially parallel surfaces. The permitted range of deviation from Platonic ideals of these geometric constructs is to be determined with reference to ranges in the specification, and where such ranges are not stated, with reference to industry norms in the field of use, and where such ranges are not defined, with reference to industry norms in the field of manufacturing of the designated feature, and where such ranges are not defined, features substantially embodying a geometric construct should be construed to include those features within 15% of the defining attributes of that geometric construct.

In this patent, to the extent certain U.S. patents, U.S. patent applications, or other materials (e.g., articles) have been incorporated by reference, the text of such U.S. patents, U.S. patent applications, and other materials is, however, only incorporated by reference to the extent that no conflict exists between such material and the statements and drawings set forth herein. In the event of such conflict, the text of the present document governs, and terms in this document should not be given a narrower reading in virtue of the way in which those terms are used in other materials incorporated by reference.

The present techniques will be better understood with reference to the following enumerated embodiments:

1. A method of determining a future battery level of one or more battery-powered computing devices, the method comprising: accessing, with one or more processors, an event record in memory describing a scheduled event in which a user of a plurality of computing devices is scheduled to participate in the future; inferring, with one or more processors, a subset of the plurality of computing devices to be used in a time period corresponding to the scheduled event; determining, with one or more processors, present battery levels of the subset of the plurality of computing devices, the levels being values indicative of an amount of energy stored by batteries; determining, with one or more processors, present usage rates of battery energy by the subset of the plurality of computing devices; inferring, with one or more processors, battery outlooks corresponding to the scheduled event, a battery outlook being an estimated amount of energy consumption attributable to the scheduled event; and predicting, with one or more processors, future battery levels of the subset of the plurality of computing devices based on at least a present battery level, a present usage rate, and a battery outlook corresponding to the scheduled event to improve battery usage or battery management of the computing device.

2. The method of embodiment 1, wherein the inferring a battery outlook corresponding to the scheduled event comprises: programmatically associating the scheduled event with a past event based on natural language text in the record describing a geolocation of the event or a description of an activity of the event; querying a battery usage log to retrieve a historical energy usage record having an amount of energy usage determined to be attributable to the past event; determining, with one or more processors, based on one or more differences between the scheduled event and the past event, a scaling factor; and scaling, based on the scaling factor, the battery usage for the past event to determine a predicted energy usage attributable to the future event.

3. The method of any one of embodiments 1-2, wherein: determining, with one or more processors, a present usage rate of battery energy comprises estimating the present usage rate based at least two of the following: (1) a usage rate at an identified time period in the past, (2) a usage rate of a current user of the computing device, (3) a usage rate based on an identified application, (4) a usage rate based on an identified plurality of tasks, or (5) a usage rate based on a plurality of peripheral components of the computing device or connected to the computing device.

4. The method of any one of embodiments 1-3, further comprising: comparing a future battery level to a threshold amount; determining, based on the comparison, that the future battery level satisfies the threshold and, in response, causing a message to presented to the user, wherein the message to a user is one or more of a recommendation to charge the device, a recommendation to alter the operation of the device, a recommendation to turn off the device, or a recommendation to use alternate sources of power.

5. The method of embodiment 4, further comprising: comparing a future use of the device with the message to create a determination of compliance with the message; storing, with one or more processors, the determination of compliance with the message; and determining whether to present a future message based on the stored determination of compliance.

6. The method of any one of embodiments 1-5, comprising: training a supervised battery-outlook estimation model on logged event records, wherein: each logged event record includes a plurality of features of a respective event and a respective amount of battery usage attributable to the respective event; and training the supervised battery-outlook estimation model comprises iteratively adjusting a plurality of model parameters, scoring current parameters with an objective function that indicates an aggregate amount of error between predictions of the model with the current parameters based on logged event record features and logged event record amounts of battery usage, and selecting new parameters as current parameters that reduce the aggregate amount of error, wherein inferring a battery outlook corresponding to the scheduled event comprises inputting features of the scheduled event into the trained supervised battery-outlook estimation model.

7. The method of any one of embodiments 1-6, further comprising: obtaining, with one or more processors, a geolocation of a subset of the plurality of computing devices; accessing, with one or more processors, a plurality of stored geolocations of charging locations; and programmatically comparing the geolocation of the subset of the plurality of computing devices with the geolocation of plurality of charging locations to return a target charging location.

8. The method of embodiment 7, further comprising: comparing a future battery level to a threshold amount to return a power expectancy; selecting or forming a message based on the target charging location and the power expectancy; and causing the selected or formed message to be presented to the user.

9. The method of any one of embodiments 1-8, comprising predicting future battery levels of the subset of the plurality of computing devices based on at least three of the following of scheduled events: predicted usage of the subset of the plurality of computing devices of greater than a threshold probability based on historical usage of the subset of the plurality of computing devices; an entry into a calendar; an entry in an agenda, an entry in a task list; a natural language unstructured human readable text of a text message having a designated n-gram, or a natural language unstructured human readable text of an email message having a designated n-gram.

10. The method of any one of embodiments 1-9, wherein: predicting battery outlooks for the scheduled event step comprises determining whether subset of the plurality of computing devices will be used at the scheduled event based on one or more of the geolocation of the scheduled event and usage at an associated past event.

11. The method of any one of embodiments 1-10, further comprising: adjusting a setting of firmware of a hardware component of subset of the plurality of computing devices based on the predicted future battery levels of the subset of the plurality of computing devices.

12. The method of embodiment 11, wherein adjusting the setting comprises: adjusting, with respect to a subset of the plurality of computing devices, a screen brightness; a clock speed; or a threshold triggering entry into a reduced power mode of a processor.

13. The method of any one of embodiments 1-12, further comprising: obtaining a task to be performed by one or more of the subset of the plurality of computing devices during the time period; and selecting for use, based on future battery levels, one or more computing devices among the subset of plurality of computing devices suitable for the task.

14. The method of any one of embodiments 1-13, further comprising: obtaining a task to be performed by one or more of the subset of the plurality of computing devices; ranking, based on future battery levels, one or more of the subset of plurality of computing devices capable of performing the task; and causing an indication of the ranking to be presented to the user.

15. A method of coordinating power usage in a plurality of devices, comprising: determining, with one or more processors, a present battery level each of the plurality of devices; determining, with one or more processors, a present usage rate for each of the plurality of devices; accessing, with one or more processors, a scheduled event; calculating, with one or more processors, a battery outlook for the scheduled event for each of the plurality of devices; calculating, with one or more processors, a future battery level, using at least the present battery level, the present usage rate, and the battery outlook for the scheduled event for each of the plurality of devices; comparing, with one or more processors, the future battery level of one or more of the plurality of devices with a threshold level to determine a power expectancy; altering, based on the power expectancy, with one or more processors, at least one usage state of one or more of the plurality of devices; and wherein altering the usage state comprises one or more of powering one or more of the plurality of devices off, closing an application, turning off an antenna, dimming a screen, or entering a sleep mode.

16. A non-transitory computer-readable medium having computer-executable instructions stored thereon which, when executed by one or more processors effectuate operations comprising: determining, with one or more processors, a present battery level of a first computing device and a second computing device, the level being a value indicative of an amount of energy stored by the battery; determining, with one or more processors, a present usage rate of battery energy by the first computing device; accessing, with one or more processors, an event record in memory describing a scheduled event in which a user of the first computing device is scheduled to participate in the future; inferring, with one or more processors, a battery outlook corresponding to the scheduled event, the battery outlook being an estimated amount of energy consumption attributable to the scheduled event; and predicting, with one or more processors, a future battery level of the first computing device based on at least the present battery level of the first computing device, the present usage rate of the first computing device, and the battery outlook corresponding to the scheduled event to improve battery usage or battery management of the computing device.

17. The medium of embodiment 16, wherein inferring the battery outlook for the scheduled event comprises: programmatically associating the scheduled event with a past event; returning a battery usage for the past event; determining, with one or more processors, based on differences between the scheduled event and the past event, a scaling factor; and scaling, based on the scaling factor, the battery usage for the past event to determine an anticipated battery usage for the future event.

18. The medium of any one of embodiments 16-17, wherein the operations further comprise comparing the future battery level to a threshold amount; determining, based on the comparison, that the future battery level satisfies the threshold and, in response, causing a message to presented to the user, wherein the message to a user is one or more of a recommendation to charge the device, a recommendation to alter the operation of the device, a recommendation to turn off the device, or a recommendation to use alternate sources of power.

19. The medium of any one of embodiments 16-18, wherein the operations further comprise: obtaining, with one or more processors, a geolocation of the first computing device; accessing, with one or more processors, a plurality of stored geolocations of charging locations; and programmatically comparing the geolocation of the first computing device with the geolocation of plurality of charging locations to return a target charging location.

20. A tangible, non-transitory, machine-readable medium storing instructions that when executed by a data processing apparatus cause the data processing apparatus to perform operations comprising: the operations of any one of embodiments 1-15.

21. A system, comprising: one or more processors; and memory storing instructions that when executed by the processors cause the processors to effectuate operations comprising: the operations of any one of embodiments 1-15.

22. A method comprising, the operations of any one of embodiments 16-18.

What is claimed is:

1. A method of determining a future battery level of one or more battery-powered computing devices, the method comprising:

accessing, with one or more processors, an event record in memory describing a scheduled event in which a user of a plurality of computing devices is scheduled to participate in the future;

inferring, with one or more processors, a subset of the plurality of computing devices to be used in a time period corresponding to the scheduled event;

determining, with one or more processors, present battery levels of the subset of the plurality of computing devices, the levels being values indicative of an amount of energy stored by batteries;

determining, with one or more processors, present usage rates of battery energy by the subset of the plurality of computing devices;

inferring, with one or more processors, battery outlooks corresponding to the scheduled event, a battery outlook being an estimated amount of energy consumption attributable to the scheduled event;

predicting, with one or more processors, future battery levels of the subset of the plurality of computing devices based on at least a present battery level, a present usage rate, and a battery outlook corresponding to the scheduled event to improve battery usage or battery management of the computing device;

comparing a future battery level to a threshold amount;

determining, based on the comparison, that the future battery level satisfies the threshold and, in response, causing a message to be presented to the user, wherein the message is one or more of: a recommendation to charge the device, a recommendation to alter the operation of the device, a recommendation to turn off the device, or a recommendation to use alternate sources of power;

comparing a future use of the device with the message to create a determination of compliance with the message;

storing, with one or more processors, the determination of compliance with the message; and determining whether to present a future message based on the stored determination of compliance.

2. The method of claim 1, wherein the inferring a battery outlook corresponding to the scheduled event comprises:

programmatically associating the scheduled event with a past event based on: 1) natural language text in the record describing a geolocation of the event; or 2) a description of an activity of the event;

querying a battery usage log to retrieve a historical energy usage record having an amount of energy usage determined to be attributable to the past event;

determining, with one or more processors, based on one or more differences between the scheduled event and the past event, a scaling factor; and scaling, based on the scaling factor, the battery usage for the past event to determine a predicted energy usage attributable to the scheduled event.

3. The method of claim 1 wherein:

determining, with one or more processors, a present usage rate of battery energy comprises estimating the present usage rate based at least two of the following:

(1) a usage rate at an identified time period in the past, (2) a usage rate of a current user of the computing device, (3) a usage rate based on an identified application, (4) a usage rate based on an identified plurality of tasks, or (5) a usage rate based on a plurality of peripheral components of the computing device or connected to the computing device.

4. The method of claim 1, comprising:
training a supervised battery-outlook estimation model on logged event records, wherein:
each logged event record includes a plurality of features of a respective event and a respective amount of battery usage attributable to the respective event; and
training the supervised battery-outlook estimation model comprises iteratively adjusting a plurality of model parameters, scoring current parameters with an objective function that indicates an aggregate amount of error between predictions of the model with the current parameters based on logged event record features and logged event record amounts of battery usage, and selecting new parameters as current parameters that reduce the aggregate amount of error,
wherein inferring a battery outlook corresponding to the scheduled event comprises inputting features of the scheduled event into the trained supervised battery-outlook estimation model.

5. The method of claim 1, further comprising:
obtaining, with one or more processors, a geolocation of a subset of the plurality of computing devices;
accessing, with one or more processors, a plurality of stored geolocations of charging locations; and
programmatically comparing the geolocation of the subset of the plurality of computing devices with the geolocation of plurality of charging locations to return a target charging location.

6. The method of claim 5, further comprising:
comparing a future battery level to a threshold amount to return a power expectancy;
selecting or forming a message based on the target charging location and the power expectancy; and
causing the selected or formed message to be presented to the user.

7. The method of claim 1, comprising predicting future battery levels of the subset of the plurality of computing devices based on at least three of the following types of scheduled events:
predicted usage of the subset of the plurality of computing devices of greater than a threshold probability based on historical usage of the subset of the plurality of computing devices;
an entry into a calendar;
an entry in an agenda,
an entry in a task list;
a natural language unstructured human readable text of a text message having a designated n-gram, or
a natural language unstructured human readable text of an email message having a designated n-gram.

8. The method of claim 1, wherein:
predicting battery outlooks for the scheduled event step comprises determining whether subset of the plurality of computing devices will be used at the scheduled event based on one or more of the geolocation of the scheduled event and usage at an associated past event.

9. The method of claim 1, further comprising:
adjusting a setting of firmware of a hardware component of subset of the plurality of computing devices based on the predicted future battery levels of the subset of the plurality of computing devices.

10. The method of claim 9, wherein adjusting the setting comprises:
adjusting, with respect to a subset of the plurality of computing devices,
a screen brightness;
a clock speed; or
a threshold triggering entry into a reduced power mode of a processor.

11. The method of claim 1, further comprising:
obtaining a task to be performed by one or more of the subset of the plurality of computing devices during the time period; and
selecting for use, based on future battery levels, one or more computing devices among the subset of plurality of computing devices suitable for the task.

12. The method of claim 1, further comprising:
obtaining a task to be performed by one or more of the subset of the plurality of computing devices;
ranking, based on future battery levels, one or more of the subset of plurality of computing devices capable of performing the task; and
causing an indication of the ranking to be presented to the user.

13. The method of claim 1, further comprising:
steps for predicting future battery levels based on scheduled events.

14. A method of coordinating power usage in a plurality of devices, comprising:
determining, with one or more processors, a present battery level each of the plurality of devices;
determining, with one or more processors, a present usage rate for each of the plurality of devices;
accessing, with one or more processors, a scheduled event;
calculating, with one or more processors, a battery outlook for the scheduled event for each of the plurality of devices;
calculating, with one or more processors, a future battery level, using at least the present battery level, the present usage rate, and the battery outlook for the scheduled event for each of the plurality of devices;
comparing, with one or more processors, the future battery level of one or more of the plurality of devices with a threshold level to determine a power expectancy;
determining, based on the comparison, that the future battery level satisfies the threshold and, in response, causing a message to be presented to the user, wherein the message is one or more of: a recommendation to charge the device, a recommendation to alter the operation of the device, a recommendation to turn off the device, or a recommendation to use alternate sources of power;
comparing a future use of the device with the message to create a determination of compliance with the message;
storing, with one or more processors, the determination of compliance with the message; and
determining whether to present a future message based on the stored determination of compliance or altering, based on the power expectancy, with one or more processors, at least one usage state of one or more of the plurality of devices; and
wherein altering the usage state comprises one or more of powering one or more of the plurality of devices off, closing an application, turning off an antenna, dimming a screen, or entering a sleep mode.

15. A non-transitory computer-readable medium having computer-executable instructions stored thereon which, when executed by one or more processors effectuate operations comprising:
determining, with one or more processors, a present battery level of a first computing device and a second computing device, the level being a value indicative of an amount of energy stored by the battery;

determining, with one or more processors, a present usage rate of battery energy by the first computing device;

accessing, with one or more processors, an event record in memory describing a scheduled event in which a user of the first computing device is scheduled to participate in the future;

inferring, with one or more processors, a battery outlook corresponding to the scheduled event, the battery outlook being an estimated amount of energy consumption attributable to the scheduled event;

predicting, with one or more processors, a future battery level of the first computing device based on at least the present battery level of the first computing device, the present usage rate of the first computing device, and the battery outlook corresponding to the scheduled event to improve battery usage or battery management of the computing device;

comparing a future battery level to a threshold amount;

determining, based on the comparison, that the future battery level satisfies the threshold and, in response, causing a message to be presented to the user, wherein the message is one or more of: a recommendation to charge the device, a recommendation to alter the operation of the device, a recommendation to turn off the device, or a recommendation to use alternate sources of power;

comparing a future use of the device with the message to create a determination of compliance with the message;

storing, with one or more processors, the determination of compliance with the message; and determining whether to present a future message based on the stored determination of compliance.

16. The medium of claim 15, wherein inferring the battery outlook for the scheduled event comprises:

programmatically associating the scheduled event with a past event;

returning a battery usage for the past event;

determining, with one or more processors, based on differences between the scheduled event and the past event, a scaling factor; and scaling, based on the scaling factor, the battery usage for the past event to determine an anticipated battery usage for the scheduled event.

17. The medium of claim 15, wherein the operations further comprise:

comparing the future battery level to a threshold amount;

determining, based on the comparison, that the future battery level satisfies the threshold and, in response, causing a message to be presented to the user, wherein the message to a user is one or more of a recommendation to charge the device, a recommendation to alter the operation of the device, a recommendation to turn off the device, or a recommendation to use alternate sources of power.

18. The medium of claim 15, wherein the operations further comprise:

obtaining, with one or more processors, a geolocation of the first computing device;

accessing, with one or more processors, a plurality of stored geolocations of charging locations; and programmatically comparing the geolocation of the first computing device with the geolocation of plurality of charging locations to return a target charging location.

* * * * *